United States Patent
Arkles et al.

(10) Patent No.: US 6,586,056 B2
(45) Date of Patent: Jul. 1, 2003

(54) SILICON BASED FILMS FORMED FROM IODOSILANE PRECURSORS AND METHOD OF MAKING THE SAME

(75) Inventors: Barry C. Arkles, Dresher, PA (US); Alain E. Kaloyeros, Slingerlands, NY (US)

(73) Assignee: Gelest, Inc., Tullytown, PA (US)

( * ) Notice: Subject to any disclaimer, the term of this patent is extended or adjusted under 35 U.S.C. 154(b) by 0 days.

(21) Appl. No.: 10/079,746

(22) Filed: Feb. 19, 2002

(65) Prior Publication Data

US 2002/0119327 A1 Aug. 29, 2002

Related U.S. Application Data

(63) Continuation of application No. 09/197,488, filed on Nov. 20, 1998, now abandoned.
(60) Provisional application No. 60/067,159, filed on Dec. 2, 1997.

(51) Int. Cl.$^7$ .............................................. C23C 16/34
(52) U.S. Cl. .................. 427/582; 427/583; 427/255.15; 427/255.17; 427/255.393; 427/255.394; 427/255.7
(58) Field of Search ................................ 427/582, 583, 427/255.15, 255.17, 255.393, 255.394, 255.7

(56) References Cited

U.S. PATENT DOCUMENTS

| | | | |
|---|---|---|---|
| 3,652,324 A | | 3/1972 | Chu et al. |
| 4,256,514 A | | 3/1981 | Pogge |
| 4,404,236 A | | 9/1983 | Komatsu et al. |
| 4,469,801 A | * | 9/1984 | Hirai et al. .................. 252/502 |
| 4,504,521 A | | 3/1985 | Widmer et al. |
| 4,585,671 A | | 4/1986 | Kitagawa et al. |
| 4,683,147 A | | 7/1987 | Eguchi et al. |
| 4,696,834 A | | 9/1987 | Varaprath |
| 4,702,936 A | | 10/1987 | Maeda et al. |
| 4,882,224 A | | 11/1989 | Moro et al. |
| 4,884,123 A | | 11/1989 | Dixit et al. |
| 5,080,933 A | | 1/1992 | Grupen-Shemensky et al. |
| 5,149,514 A | | 9/1992 | Sanjurjo |
| 5,180,690 A | * | 1/1993 | Czubatyj et al. ............. 136/258 |
| 5,244,698 A | | 9/1993 | Ishihara et al. |

FOREIGN PATENT DOCUMENTS

| | | |
|---|---|---|
| GB | 1044041 | 5/1963 |
| GB | 2199046 A | 6/1988 |
| JP | 60-043484 A | 3/1985 |
| JP | 60-086275 A | 5/1985 |
| JP | 60-089575 A | 5/1985 |
| WO | WO 90/11858 A1 | 10/1990 |
| WO | WO 97/10147 A1 | 3/1997 |

OTHER PUBLICATIONS

Office Action dated Oct. 15, 2001 from German Patent Office in counterpart German Application No. 198 82854.3.
Faltermeier, Cheryl, "Barrier Properties of Titanium Nitride Films Grown by Low Temperature Chemical Vapor Deposition From Titanium Tetraiodide," J. Electrochem. Soc., vol. 144, No. 3, pp. 1002–1008 (Mar. 1997).
**Partial Translation.
Arkles, Barry C., "Silicon Nitride From Organosilazane Cyclic and Linear Prepolymers," J. Electrochem. Soc., vol. 133, No. 1, pp. 233–234 (Jan. 1986).
El–Kareh, *Fundamentals of Semiconductor Processing Technology*, pp. 38–77 and pp. 466–515, Kluwer Academic Publishers (1995).
Obeng, Yaw S., "Dielectric Materials for Advanced VLSI and ULSI Technologies," AT&T Technical Journal, pp. 94–110 (May/Jun. 1994).
Gregory, J.A., "Characterization of Low Pressure Chemically Vapor Deposited Silicon Nitride Using Experimental Design," Thin Solid Films, vol. 206, pp. 11–17 (1991).
Kuo Yue, "PECVD Silicon Nitride as a Gate Dielectric for Amorphous Silicon Thin Film Transistor, Process and Device Performance," J. Electrochem, Soc., vol. 142, No. 1, pp. 186–190 (Jan. 1995).
Cotler, Tina J., "High Quality Plasma–Enhanced Chemical Vapor Deposited Silicon Nitride Films," J. Electrochem. Soc., vol. 140, No. 7, pp. 2071–2075(Jul. 1993).
Parsons, G. N., "Low Hydrogen Content Stoichiometric Silicon Nitride Films Deposited by Plasma–Enhanced Chemical Vapor Deposition," J. Appl. Phys., vol. 70, No. 3, pp. 1553–1560 (Aug. 1, 1991).
Yin, Z., "Optical Dielectric Function and Infrared Absorption of Hydrogenated Amorphous Silicon Nitride Films; Experimental Results and Effective–Medium–Approximation Analysis, The American Physical Society," vol. 42, No. 6, pp. 3666–3675 (Aug. 15, 1990).

(List continued on next page.)

*Primary Examiner*—Timothy Meeks
(74) *Attorney, Agent, or Firm*—Akin, Gump, Strauss, Hauer & Feld L.L.P.

(57) ABSTRACT

A method for near atmospheric pressure chemical vapor deposition of a silicon based film onto a substrate includes introducing into a deposition chamber at about atmospheric pressure: (i) a substrate; (ii) an iodosilane precursor in the vapor state having at least three iodine atoms bound to silicon; and (iii) at least one reactant gas; and maintaining a deposition temperature within the chamber from about 250° C. to about 650° C. for a period of time sufficient to deposit a silicon based film on the substrate. Silicon based films formed by near atmospheric pressure chemical vapor deposition using an iodosilane precursor in a vapor state and methods for forming silicon-based films using ultraviolet assisted chemical vapor deposition are also included.

17 Claims, No Drawings

OTHER PUBLICATIONS

Lanford, W.A., "The Hydrogen Content of Plasma–Deposited Silicon Nitride," J. Appl. Phys., vol. 49, No. 4, pp. 2473–2477 (Apr. 1978).

Efstathiadis, H., "Characterization of Amorphous Carbon Fims Based on Carbon, Nitrogen, and Hydrogen," Mat. Res. Soc. Symp. Proc., vol. 415, Materials Research Society, pp. 51–56 (1996).

Beach David B., "Infrared and Mass Spectroscopic Study of the Reaction of Silyl Iodide and Ammonia. Infrared Spectrum of Silysmine," Inorganic Chemistry, vol. 31, No. 20, pp. 4174–4177 (1992).

Valdes, J.L., "Silane Alternatives for Silicon IC Manufacturing," 27th International SAMPE Technical Conference, pp. 315–327 (Oct. 9–12, 1995).

Schuh Heinz, "Zeitschrift fur anorganische und allgemeine Chemie: Disilanyl–amines—Compounds Comprising the Structural Unit Si–Si–N, as Single–Source Precursors for Plasma Enhanced Chemical Vapour Deposition (PE–CVD) of Silicon Nitride," 619, p. 1347–1352 (1993).

Goldberg Cindy, "Low temperature In–Situ Sequential Chemical Vapor Deposition of Ti/TiN Ultrathin Bilayers for ULSI Barrier Applications," Conference Proceedings ULSI–X, Materials Research Society, pp. 247–257 (1995).

Sun, X., "Reactively Sputtered Ti–Si–N Films I. Physical Properties," J. Appl. Physics, vol. 81, No. 2 pp. 656–663 (Jan. 15, 1997).

Pokela, P.J., "Amorphous Ternary Ta–Si–N Diffusion Barrier Between Si and Au," J. Electrochem. Soc., vol. 138, No. 7, pp. 2125–2129 (Jul.1991).

Reid, J.S., "Amorphous (Mo, Ta, or W)—Si–N Diffusion Barriers for Al Metallizations," J. Appl. Phys., vol. 79, No. 2, pp. 1109–1115 (Jan. 15, 1996).

Fleming, J.G., "Characteristics of CVD Ternary Refractory Nitride Diffusion Barriers," Conference Proceedings ULSI XII, Materials Resesarch Society, pp. 245–251 (1997).

Smith, Paul, "Chemical Vapor Deposition of Titanium–Silicon–Nitride Films," Appl. Phys. Lett., vol. 70, No. 23, pp. 3116–3118 (Jun. 9, 1997).

Leskelä, M., "Atomic Layer Epitaxy In Deposition of Various Oxide and Nitride Thin Films," Journal De Physique IV, Colloque C5, supplément au Journal de Physique II, vol., 5 pp. C5–937–C5951 (Jun. 1995).

Pierson, Hugh O., *Handbook of Chemical Vapor Deposition (CVD) Principles, Technology and Applications*, Noyes Publications, Park Ridge New Jersey, pp. 98–102 (1992).

* cited by examiner

SILICON BASED FILMS FORMED FROM IODOSILANE PRECURSORS AND METHOD OF MAKING THE SAME

CROSS REFERENCE TO RELATED APPLICATIONS

This application is a continuation of Application No. 09/197,488, filed Nov. 20, 1998, now abandoned entitled "Silicon Based Films Formed From Iodosilane Precursors And Method Of Making The Same," and further claims the benefit of priority under 35 U.S.C. §119(e) of U.S. Provisional Application No. 60/067,159, filed Dec. 2, 1997. The entire disclosures of U.S. application Ser. No. 09/197,488 and of U.S. Provisional Application No. 60/067,159 as filed are incorporated herein by reference.

BACKGROUND OF THE INVENTION

Semiconductor technologies such as flat panel displays and solar applications which involve thin film transistors (TFT) and microelectronic devices such as RAM (memory and logic chips), employ silicon based thin films for various purposes including semiconductor substrates, diffusion masks, oxidation barriers, and dielectric layers. Current manufacturing technologies for producing these films use precursors such as silane ($SiH_4$) for thermal low-pressure chemical vapor deposition (LPCVD) or plasma enhanced CVD (PECVD). Unfortunately, the thermal LPCVD methods require temperatures in excess of 700° C., and the plasma assisted methods require use of a vacuum environment.

The use of these thermal and plasma assisted CVD technologies precludes efficient and cost-effective production of silicon based film systems for many applications. The high processing temperatures of thermal CVD methods require large energy input and are incompatible with some semiconductor applications. For example, use of low cost glass substrates in TFT applications requires processing temperatures below 400° C.

Plasma assisted CVD techniques provide a lower temperature alternative to thermal CVD, but they also have several important drawbacks. First, plasma use often causes large hydrogen concentrations in the resulting films, which may lead to film instability and device degradation. Plasma methods may also result in ion bombardment damage to underlying device structures. Finally, plasma assisted techniques require a vacuum environment. The required vacuum equipment makes plasma assisted CVD equipment much more complicated and expensive to manufacture and operate than the equipment typically used for near atmospheric pressure CVD. Additionally, the vacuum environment of plasma assisted CVD is not compatible with film formation for many important semiconductor technologies such as flat panel displays and solar applications, which involve large area substrates and high throughput demands.

Traditional CVD precursors for forming silicon based films have also caused difficulties in semiconductor film deposition. Many known precursors such as silane, disilane, dichlorosilane, and trichlorosilane have minimum film deposition temperatures so high that their use as precursors for semiconductor applications that require low processing temperatures is precluded. Such known precursors also tend to have low film growth rates at their minimum deposition temperatures, which makes CVD methods using these precursors inefficient. Additionally, widely used silane precursors require stringent safety precautions, as they can be pyrophoric, toxic, and corrosive.

Due to the manufacturing requirements of the semiconductor industry and the above-mentioned processing disadvantages of traditional high temperature CVD techniques, plasma assisted CVD techniques, and standard silicon precursors, there exists a need in the art for a low temperature, near atmospheric pressure CVD (APCVD) technique which does not require plasma assistance or use silane or other traditional silicon precursors, such as those listed above. The inventors named in this patent application have developed methods using organic silicon precursors, as described in B. Arkles, "Silicon Nitride from Organosilazane Cyclic and Linear Prepolymers," *Journal of the Electrochemical Society*, Vol. 133, No. 1 (1986), pp.233–234; and B. Arkles et al., A. Kaloyeros et al., "Atmospheric Chemical Vapor Deposition of Silicon Nitride," 31 st Organosilicon Symposium, May 29, 1998. The material presented at the Organosilicon Symposium in May, 1998 is also the subject of a co-pending U.S. Patent Application of the same inventors named in the present application. However, the organic precursors can require a somewhat complex synthesis, such that a need still exists in the art for an alternative low temperature, near atmospheric pressure CVD method which employs a simple inorganic precursor. Further, when using organic precursors, generally process parameters have to be controlled to minimize incorporation of low levels of carbon into films.

BRIEF SUMMARY OF THE INVENTION

The present invention includes a method for near atmospheric pressure chemical vapor deposition of a silicon based film onto a substrate, comprising introducing into a deposition chamber at about atmospheric pressure a substrate, an iodosilane precursor in a vapor state, the precursor having at least three iodine atoms bound to silicon, and at least one transport gas. The deposition temperature is maintained within the chamber from about 250° C. to about 650° C. for a period of time sufficient to deposit a silicon based film on the substrate.

In an alternative embodiment, the invention includes a method for near atmospheric pressure chemical vapor deposition of a silicon based film onto a substrate, comprising introducing into a deposition chamber at about atmospheric pressure a substrate, a precursor in a vapor state, and at least one transport gas. Ultraviolet radiation is provided to the chamber such that the radiation reaches an interface between the substrate and the precursor, and the chamber is heated for a period of time sufficient to deposit a silicon based film on the substrate.

The invention further includes a silicon based film formed by chemical vapor deposition at about atmospheric pressure using an iodosilane precursor in a vapor state having a formula (I):

$$I_{(4-n)}SiX_n \quad (I)$$

wherein n=0 or 1 and X is selected from the group consisting of a bromine atom, a chlorine atom, a hydrogen atom, and a triiodosilyl moiety.

DETAILED DESCRIPTION OF THE INVENTION

The present invention relates to silicon based films formed from iodosilane precursors and associated methods for the near atmospheric pressure chemical vapor deposition of such films on various substrates. The method of the invention may deposit such silicon based films as a single film on a substrate, or as one of several layers applied to a substrate forming a multilayered structure.

As used herein, silicon based films are those films or coatings which have silicon as a major component. In one embodiment, such silicon based films are silicon nitride films, typically having the chemical formula $SiN_x$, wherein x is greater than 0 and preferably no greater than 2. Preferably x ranges from about 1.0 to 1.9. While there may be some impurities in the films of the invention, which are residual components from the deposition reactants, such as iodine, hydrogen, and oxygen, it is preferred that the films have impurity concentrations that are as low as possible, and most preferably, the films are pure. If impurities are present, preferably they are less than 35 at % for hydrogen, 10 at % for oxygen, and 5 at % for iodide. In another embodiment, the silicon based films are silicon oxide films with the formula $SiO_y$, wherein y is greater than 0 and preferably no greater than 2.2, and preferably ranges from about 1.8 to about 2.0. These films are also preferably pure, with impurity concentrations for hydrogen and iodide similar to those noted above for forming silicon nitride films. In a third embodiment, the silicon based films are preferably pure silicon films with minor, and preferably no impurities. Any presence of impurities for semiconductor silicon films is preferably less than about 35 at % hydrogen and 3% iodide. Similarly, films of the formula $SiN_xO_y$ may also be made in accordance with the invention, where x and y range from greater than 0 to about 2.0 and the sum of x+y is ≦about 3.0. Such films are preferably pure, and, if present, the levels of impurities are as noted above for hydrogen and iodide.

Such films are especially useful on substrates such as semiconductor substrates, for example, silicon and gallium arsenide substrates, having sub-micron features and structures. Preferred semiconductor substrates include, for example, silicon, silicon dioxide, or silicon-nitrogen materials or doped versions or as part of the interconnect architecture. When forming a flat panel, the preferred substrate is silicon dioxide or glass. The substrate may be varied in accordance with the application. The films may also be used in ultra-large scale integration (ULSI) circuitry on substrates with sub-quarter-micron device features. The films are also especially useful on flat panel display and solar application substrates, such as glass including transparent glass substrates, borosilicate glass, temperature resistant flat panels and quartz. Display glass is also a preferred substrate for flat panel displays and solar applications.

Examples of other substrates which may be coated include metal, and polymeric materials such as plastics, for applications including, for example, hard protective coatings for aircraft components and engines, automotive parts and engines, and cutting tools. Preferred metal substrates include aluminum, beryllium, cadmium, cerium, chromium, cobalt, copper, gallium, gold, iron, lead, manganese, molybdenum, nickel, palladium, platinum, rhenium, rhodium, silver, stainless steel, steel, iron, strontium, tin, titanium, tungsten, zinc, zirconium, and alloys and compounds thereof, such as silicides, carbides and the like.

There is really no limitation on the type of substrate which can be used in the present method. However, the substrate is preferably stable at the conditions used for depositing the film or films onto the substrate. That is, the substrate is preferably stable at temperatures between about 250° C. and about 650° C. depending on the type of film to be deposited and the intended use of the coated substrate.

According to the CVD processes used in the method of the present invention, single, bilayered or other multilayered films may be placed on the substrates. The single or multi-layered films can be deposited in different reactors, or in a single reactor, or a combination thereof. For example, several layers can be deposited in a single reactor and a subsequent layer can be deposited in a separate reactor. In multilayer depositions when more than one reactor is used, the reactors may be separate reactors which are unconnected in the case of near atmospheric CVD. In the case of multilayer depositions using more than one reactor and low pressure CVD, the reactors may be unconnected separate reactions or may be interconnected through leak-tight transfer arms and load locks which allow sample transfer between the different reactors without exposing the coated substrate to air.

The iodosilane precursors according to the present invention are iodosilanes having at least three iodine atoms bound to silicon and are introduced in the vapor state. More preferably, the indosilane precursors are those having a formula (I) as set forth below:

$$I_{(4-n)}SiX_n \qquad (I)$$

wherein n=0 or 1 and X may be a bromine atom, a chlorine atom, a hydrogen atom or a triiodosilyl moiety Although it should be understood that X may be other similar elements or groups.

In the preferred embodiment, the iodosilane precursor for forming silicon based films is teraiodosilane. Tetraiodosilane is preferred because it is a simple silicon bearing precursor which can be used in thermally or UV-assisted deposition processes. Further, the iodosilane precursors of the invention are simple silicon-bearing precursors which do not require a difficult and time-consuming synthetic process. The iodosilane precursors also provide for high film growth rates and tow minimum film deposition temperatures. For example, when used in conjunction with ammonia and nitrogen to form silicon-nitrogen based films, the iodosilane precursors have a minimum deposition temperature of about 250° C. (or by light with wavelengths shorter than 260 nm) and a growth rate at that temperature of 500 Å/min.

In the preferred embodiment, the iodosilane precursor for forming silicon based films is tetraiodosilane. Tetraiodosilane is preferred because it is a simple silicon bearing precursor which can be used in thermally or UV-assisted deposition precesses. Further, the iodosilane precursors of the invention are simple silicon-bearing precursors which do not require a difficult and time-consuming synthetic process. The iodosilane precursors also provide for high film growth rates and low minimum film deposition temperatures. For example, when used in conjunction with ammonia and nitrogen to form silicon-nitrogen based films, the iodosilane precursors have a minimum deposition temperature of about 250° C. (or by light with wavelengths shorter than 260 nm) and a growth rate at that temperature of 500 Å/min.

The preferred iodosilane precursors may be used in conjunction with reactant gas(es) which can include hydrogen or, for example, nitrogen-containing reactive gases or oxygen-containing reactive gases, to form films with other major components besides silicon, such as nitrogen or oxygen. In one preferred embodiment, an iodosilane precursor, such as tetraiodosilane, is used in conjunction with a nitrogen-containing reactant gas, such as ammonia, for the formation of silicon-nitrogen based films. This embodiment further provides a CVD process which can sequentially deposit silicon-nitrogen based films having differing silicon and nitrogen contents for a particular application. It is possible to vary the stoichiometric relation between the silicon and nitrogen in the silicon-nitrogen based film in several ways. The concentration ratio of Si source to N source in the CVD reaction, or substrate temperature, or both may be varied during the deposition process to control the silicon-to-nitrogen ratio in the resulting film. Alternatively, the ratio may be varied by changing the nature of the nitrogen-containing reactant gas. These techniques can produce single, bilayered or other multilayered films with varying silicon-to-nitrogen ratios. For example, a film can be deposited which has multiple layers of $SiN_x$, with x gradually ranging from well below 1 for the first layer, i.e., a silicon-rich layer, to well above 1 for the last surface layer, i.e., a nitrogen rich layer.

Regardless of the exact identities of the nitrogen-containing reactant gas, as described below, if a stoichiometric $Si_3N_4$ film is desired, at least 4 moles of nitrogen atoms should be present in the reaction chamber for each three moles of silicon. If less than a stoichiometric amount of nitrogen is present in the deposition chamber, then a silicon-rich film, such as $SiN_x$, where x<1, will be deposited. This could allow the formation of a mixed phase film, i.e., a film having phases of pure silicon and silicon-rich nitrides. A mixed phase film might be preferred for some applications, and methodology to prepare such films and substrates having these films coated thereon is within the scope of the invention.

Additionally, it is important to maintain an excess of nitrogen atoms, i.e., more than one mole of nitrogen atoms in the reaction chamber for each mole of silicon in the reaction chamber, if a nitrogen-rich film is desired. If excess nitrogen is present in the deposition chamber, then a nitrogen-rich film, such as $SiN_x$, where x>1, will be deposited. This also could allow the formation of a mixed phase film, i.e., a film having phases of pure silicon and nitrogen-rich nitride. Similarly, in forming $SiO_y$ or $SiN_xO_y$ films, the ratio of silicon to oxygen, or silicon to oxygen and silicon to nitrogen, respectively can be varied to form silicon-rich, oxygen-rich or nitrogen-rich films in the same manner as noted above with respect to $SiN_x$ films.

A representative, possible reaction mechanism which results in the deposition of silicon-nitrogen based films from iodosilanes, such as tetraiodosilane, and a reactant gas such as ammonia involves reacting a reactant gas containing nitrogen and hydrogen, such as ammonia, with diaminosilanes or silazanes to yield silicon nitride. A by-product of such a reaction, as shown below, is ammonium iodide which is continuously withdrawn from the deposition chamber. One contrast to traditional CVD methods which utilize $SiH_4$ is that the pathways lead to low levels of hydrogen bound to silicon resulting in higher levels of purity from the iodosilane precursors. It is believed that some of the general steps in an exemplary reaction mechanism demonstrating the initial reactions of a tetraiodosilane precursor with ammonia are as follows, wherein the formed diaminosilanes and silazanes would then react with ammonia to form the silicon nitride film. Similar reaction mechanisms occur using other reactant gases for forming silicon oxide and/or silicon oxynitride films.

$$SiI_4 + NH_3 \rightarrow SiI_4(NH_3)$$

$$Si_4(NH_3) + NH_3 \rightarrow H_2NSiI_3 + NH_4I$$

$$H_2NSiI_3 + 2NH_3 \rightarrow (H_2N)_2SiI_2 + NH_4I$$

$$H_2NSiI_3 + SiI_4 + NH_3 \rightarrow I_3SiNHSiI_3 + NH_4I.$$

In the method of the present invention for forming silicon based films from iodosilane precursors, the vapor phase precursor, with or without a carrier gas depending on the delivery system, and the at least one reactant gas are introduced into a deposition chamber. The at least one reactant gas reacts with the precursor and forms the silicon nitride film on the substrate. As noted above, the reactant gas may include inert components as well as a gas for reacting with the precursor. Inert gases may function as dilution gases, as described below, or to transport the reactant gas into the chamber. The precursor may also be introduced with an inert carrier gas. As described below, it is preferred that the reactant gas and the precursor be delivered separately to prevent premature reaction before the reactant gas and precursor are both within the chamber.

The reactant gas may be introduced into the chamber as a single gas along with the optional introduction of a separate inert gas, or the reactant gas may be present as a gaseous mixture which may include inert components. Although for convenience purposes, the gas(es) discussed herein are referred to as "reactant" gas(es), once inside the chamber, the reactant gas may also function to help direct the precursor to the substrate in the chamber in addition to reacting with the precursor, depending on the circumstances of the deposition.

In general, the reaction conditions for transport of the reactive gas(es) are generally such that little or no reaction occurs with the precursor until reaching the deposition chamber where there is usually an abrupt change in the environment. Substantially no reaction, and preferably no reaction at all, occurs during transport and the reaction occurs once the reactant gas(es) and precursor are wholly within the chamber. Non-reactive dilution gases may be introduced with the reactant gas to serve to dilute achieve near atmospheric pressure inside the deposition chamber.

As noted above, the reactant gas may be a single gas or gaseous mixture. The reactant gas(es) may include one or more inert gas, preferably one or more of the noble gases, such as helium, argon, krypton, neon, and/or xenon. Nitrogen may also be introduced along with the reactant gas as a dilution and/or a separator gas as described below. The reactant gas(es) preferably also include hydrogen; halogens such as fluorine and/or chlorine; nitrogen-containing species such as ammonia for forming silicon nitrides and/or oxygen-containing species for forming silicon oxides and the like. The transport gas(es) can be varied depending upon the type of film to be formed.

When using a reactant gas it is preferred that there also be dilution and separator gases. A separator gas is introduced into the chamber such that it flows between the reactant gas and the precursor gas. The gases are preferably introduced such that the precursor, which may include any suitable carrier gas such as nitrogen, is introduced through one opening into the chamber, and the reactant gas through a separate opening in the chamber. An additional opening, located between the openings for the reactant gas(es) and the precursor is also preferably present for introduction of a separator gas. The dilution gas may be the same as the reactant gas or may be the same as the separator gas, and is present in order to ensure that the reaction will be near atmospheric pressure. Preferably the dilution gas is the same as the reactant gas or nitrogen.

This flow design is preferred because it effectively prevents gas phase reaction between the reactant gas and the precursor until the gases reach the chamber. Premature reaction can generate particulates or other non-volatile species and/or impurities in some cases which may interrupt the purity of the film. The separator gas provides an inert laminar flow separating precursor from reactant until reaching the turbulence of the deposition surface. It operates to minimize the potential of mixing of the reaction gas(es) and the precursor. The dilution gas may be the same as or different from the reactant gas, but is preferably the same. Preferred dilution gases include nitrogen-containing gases such as ammonia or nitrogen when forming silicon nitride films, oxygen or oxygen-containing gases for formation of silicon oxide films, hydrogen for forming pure silicon films, and either oxygen-containing or nitrogen-containing gases, or mixtures thereof, for forming silicon oxynitride films. The separator gas is preferably nitrogen in formation of silicon nitride or for other films, the separator gas may be any inert and/or carrier gas which does not react directly with the precursor or the reactant gas.

The use of and choice of a reactant gas depend upon the type of film which is to be deposited. For example, if a $SiO_y$ film is to be formed, a reactant gas containing oxygen must be introduced into the deposition chamber along with the iodosilane precursor. Preferred oxygen-containing reactant gases include oxygen, ozone, and water. Similarly, in the preferred embodiment described above for the preparation of silicon-nitrogen based films, a nitrogen-containing reactant gas must be introduced into the chamber. Preferred nitrogen-containing reactant gases include ammonia, and hydrazine. Most preferably, the reactant gas for forming silicon nitride is ammonia. For formation of pure silicon films, hydrogen is a preferred reactant gas. When forming silicon oxynitrides, the reactant gas preferably includes a mixture of ammonia and/or hydrazine or other nitrogen-containing reactive gas with an oxygen-containing reactive gas such as ozone, oxygen and water. An inert component, such as those mentioned above, may be introduced simultaneously or separately with respect to the reactant gas.

In the thermal deposition processes, the chamber is operated at a deposition temperature between about 250° C. and about 650° C., preferably between about 350° C. and about 600° C., and most preferably between about 350° C. and about 550° C. The iodosilane precursor and the reactant gas(es) are introduced to the chamber having a substrate to be coated with or without dilution and/or separator gases. The processing pressure within the chamber is maintained near atmospheric pressure for APCVD, preferably using a dilution gas as described above. More specifically, processing pressures are about atmospheric pressure, i.e. they range from about 600 torr to about 1000 torr, and preferably from about 700 torr to about 800 torr.

The materials introduced to the chamber are maintained under the reaction conditions for a period of time sufficient to deposit a silicon based film onto the substrate. The time may be varied depending on the growth rate in order to achieve the desired film thickness. The deposition step typically takes from about 30 seconds to about 30 minutes, most preferably about 5 minutes, but the time is dependent upon the type of film to be deposited, the processing conditions, the desired film thickness and the reactant gas employed.

Alternating or sequentially deposited multilayers of silicon based films and/or other semiconductor films may be provided to the substrate, preferably, but not necessarily, while the substrate is kept in a single deposition reactor. The substrate, vapor phase precursor, and reactant gas are provided to the deposition chamber, and the preferred deposition temperatures and pressures noted above are maintained within the chamber. Once the first layer is formed, the same or other preferred reactant gases are then provided, when necessary, for forming alternating or sequential film layers. Either a silicon based film formed in accordance with the claimed invention using the iodosilane precursors, or another film used in the semiconductor industry, such as a tantalum based or titanium based film, can be deposited first onto the substrate. The various layers, including layers formed in accordance with the invention or other semiconductor or other films, can then be alternated or applied in any given order or sequence.

Alternatively, such multiple layers of silicon based films and other semiconductor films can be deposited on a substrate while the substrate is moved within the single deposition reactor. Further, the multiple layers can be provided to the substrate while the substrate is moved between two or more separate reactors, each used for deposition of one or more of the layers depending upon the particular application of the coated substrate. The substrate can be moved from one reactor, where one or more such layer is deposited, to another reactor(s), where additional layer(s) are deposited. Preferably, if low pressure CVD is used, the reactors are interconnected through leak-tight transfer arms and/or load locks which allow sample transfer between the different reactors without exposing the coated substrate to air, however this is not necessary.

To prepare the silicon based films according to the present invention, any CVD apparatus having the general criteria discussed below may be used. The reactants are introduced into the CVD reactor in gaseous form, with the precursor in the vapor state. The energy necessary for bond cleavage and chemical reaction is supplied by thermal energy. Alternatively, as discussed below with respect to an alternative preferred embodiment of the invention, some of the required energy may also be supplied by ultraviolet radiation.

Any CVD reactor having a suitable precursor delivery system which is used to store and control delivery of the precursor may be used. For low pressure CVD, the reactor should also have a vacuum chamber and a pumping system to maintain an appropriate pressure. It is also preferred that the CVD reactor for either near atmospheric or for low pressure CVD include a temperature control system, and gas or vapor handling capability to meter and control the flow of reactants and products resulting from the process.

In depositing silicon based films according to the present invention, the precursor delivery system may be any of the following: a pressure-based bubbler or sublimator, a hot-source mass flow controller, a liquid delivery system, or a direct liquid injection system or similar apparatus. Preferably, the precursor is placed in a reservoir which could be heated by a combination of resistance heating tape and associated power supply to a temperature which is high enough to ensure the precursor's sublimation or vaporization, but not so high as to cause premature decomposition of the precursor. A mass flow controller, which may be isolated from the reservoir by a high vacuum valve, is preferably provided to help control gas flow into the reservoir.

A carrier gas may function to carry the vapor phase precursor into the CVD chamber when a conventional pressure- and/or temperature-based mass flow control precursor delivery system is used. Alternatively, such gas(es) may function as pressurizing agents when using a liquid delivery system for the delivery of the precursor to the CVD reactor. Such a system may include a combination micropump and vaporizer head. A suitable example of such a system is the MKS Direct Liquid Injection system. A further example of a suitable delivery system for the source precursor is a hot source mass flow controller, for example, an MKS Model 1150 MFC, which does not require the use of a transport or pressurizing gas. A further example is a solid source delivery system, for example, the MKS 1153 system, which does not require the use of a carrier or pressurizing gas.

In a preferred embodiment, the precursor vapor and reactant gas are introduced into the CVD reactor through separate delivery lines, which are maintained at a temperature up to 20° C. greater than the reservoir temperature, using a combination of resistance heating tape and an associated power supply, to prevent precursor recondensation. The CVD reactor may be an eight-inch wafer, cold-wall, stainless steel CVD reactor. The reactor may also be optionally equipped with an electrical bias on the substrate. The bias can be derived from direct current, a low radio frequency of less than 500 kHz, a high radio frequency of from 500 kHz to about $10^6$ kHz, or a microwave frequency of from about $10^6$ kHz to about $10^8$ kHz and similar sources.

While the reactor may be operated low pressure or, preferably, at near atmospheric pressure, slight negative pressure in the CVD deposition reactor may be used to draw the gases and precursor into the chamber.

After being charged to the reservoir, the precursor is maintained at a temperature high enough to ensure its rapid sublimation or vaporization into the CVD chamber, but not so high as to cause its premature decomposition. Preferably, the precursor is maintained at a temperature of from about 100° C. to about 200° C. When conventional pressure-and/or temperature-based mass flow control type or solid-source-type delivery systems are used to control the flow of precursor into the CVD reactor, the temperature of precursor in the reservoir plays a key role in controlling its rate of delivery into the chamber. Alternatively, when a liquid delivery system is used, for example, the MKS Direct Liquid Injection system consisting of a combination micropump and vaporizer head, the liquid in the reservoir is room temperature. In such a liquid delivery system, the vaporizer head, not the liquid in the reservoir, is heated to a temperature which is high enough to ensure the precursor's sublimation or vaporization, but not so high as to cause its premature decomposition.

When a gas is used for delivery, any gaseous substance may be used which is not substantially reactive with the precursor or which reacts with the precursor to form an intermediate product which is more easily transported to the reaction zone and/or could more readily decompose to yield the desired silicon based film. Exemplary carrier gases include nitrogen in forming silicon nitride, or any of the inert gases listed above. In all modes of delivery described above, the flow rate of the vapor of the precursor could range from about 0.01 to about 2000 standard $cm^3/min$. Preferably the flow rate of precursor vapor into the CVD chamber is from about 0.1 to about 100 standard $cm^3/min$. The flow of reactant gas, which may be a single gas or a mixtures of gases, is preferably from about 10 standard $cm^3/min$ to about 100 standard l/min, and more preferably from about 100 standard $cm^3 min$ to about 5 standard l/min. The separator gas is preferably introduced at a rate which provides laminar flow sufficient to separate the reactant and precursor gases at the rates specified above, and preferably at a rate similar to, and preferably somewhat higher than the flow rate of the reactant gas and the precursor. The corresponding reactor pressure is preferably about 600 torr to about 1000 torr, and more preferably from about 700 torr to about 800 torr.

In a separate preferred embodiment, a low temperature CVD process can be carried out using ultraviolet radiation to supply part of the energy necessary to promote film deposition. In such an embodiment, an ultraviolet radiation source is provided, such that ultraviolet radiation may be introduced into the chamber. The use of ultraviolet radiation allows for excellent CVD results at lower temperatures than would otherwise be required, and acts as a practical alternative to use of plasma assisted or high energy plasma deposition. However, because there is no plasma, a vacuum environment is not required. Thus, high throughput and use with large area substrates are possible, such that the method is well suited for use with flat panel displays and solar applications.

Ultraviolet radiation assisted CVD may be carried out at near atmospheric pressure and is preferably practiced with a transparent substrate, like the display glass often used for flat panel displays and solar applications, such that the ultraviolet radiation may be introduced into the chamber by passing the radiation through the substrate such that the ultraviolet radiation reaches the interface between the substrate and the precursor. While the majority of the ultraviolet radiation is intended to be transmitted through the substrate and to act directly at the interface between the substrate and precursor, some radiation may be "lost" by passing around the substrate or continuing past the substrate/precursor interface without acting at the surface to encourage film deposition. The chamber may be designed such that this "lost" ultraviolet radiation is further focused and reflected back to the substrate/precursor interface. Standard CVD reaction chambers typically used in the CVD art may be used with this method provided they include an ultraviolet radiation source. The ultraviolet radiation passing through the substrate may also be enhanced by additional ultraviolet radiation sources within the portion of the chamber into which the precursor is introduced.

Use of deep ultraviolet radiation, with a preferred wavelength range between about 160 nm and about 400 nm, and more preferably from about 194 nm to about 254 nm may be used with this method. However, higher energy radiation such as electron beam energy may also be used in accordance with the present invention. In a preferred embodiment, the wavelength of the ultraviolet radiation may be altered by introducing a complexing agent such as a tertiary amine or any complexing agent having a chromophore into the chamber. For example, triethylamine may be introduced as a complexing agent when a silicon film is deposited from an iodosilane precursor carried by a hydrogen gas.

The use of ultraviolet radiation allows for low processing temperatures. In general, temperatures are preferably between about 100° C. and about 600° C., and more preferably between about 200° C. and about 425° C. Multiple layers of different films may also be formed in accordance with the ultraviolet radiation assisted CVD method, depending on the optical properties of the materials and the optical thickness.

Ultraviolet assisted CVD as described above is preferably carried out at near atmospheric pressure. This alleviates the need for a vacuum environment, which is expensive and cumbersome to provide, and is incompatible with the large area substrates and high throughput requirements involved in TFT applications such as flat panel displays and solar applications. However, the ultraviolet assisted CVD methods of the present invention are compatible with standard vacuum CVD techniques and may be practiced in conjunction with LPCVD or plasma assisted CVD.

Iodosilane precursors are preferred precursors for ultraviolet assisted CVD because they undergo ultraviolet-driven excitation of non-bonding electrons to sigma antibonding orbitals. In addition, they are simple silicon bearing precursors which allow much faster film growth rates and much lower minimum film deposition temperatures than many other silicon precursors known in the art, and they do not present the safety hazards associated with traditional silane precursors. However, ultraviolet radiation assisted CVD as described above may be used to produce silicon based films from any silicon precursors known in the art. Besides tetraiodosilane precursors, preferred silicon precursors for use with ultraviolet assisted CVD include hexaiodosilane, triiodosilane, and the like. It is also contemplated that the ultraviolet assisted CVD method may be used with other well known precursors for silicon-based films or those which are to be developed. As such, while iodosilane precursors are preferred for the reasons noted above, it will be understood, based on this disclosure that any suitable precursor for silicon-based films may be used with the ultraviolet assisted method of the invention.

It should be understood, based on the disclosure, that any suitable APCVD technology for preparing silicon based films, alone or in combination, may be used in accordance with the method of the present invention using an iodosilane precursor. Further, any known APCVD techniques, including but not limited to the preferred thermal and ultraviolet radiation assisted techniques described above, may be used with an iodosilane precursor to form single, bilayered, or multilayered films on a substrate. It will also be understood, based on this disclosure, that the ultraviolet radiation assisted CVD methods described herein have wide application for use with various precursors and substrates that are difficult to coat.

The invention will now be further illustrated in accordance with the following non-limiting examples:

EXAMPLE 1

Silicon nitride films were formed using tetraiodosilane as a precursor. Depositions were performed in a rectangular CVD reactor system which incorporated a Watkins Johnson monoblock injector. A silicon wafer substrate was placed on a quartz plate holder heated by resistance heating. The substrate temperature was monitored by a thermocouple near the back surface of the quartz holder. Depositions were carried out at substrate temperatures of 300–550° C. The chamber pressure was fixed at 100 kPa during all deposition runs.

As noted above, tetraiodosilane served as the silicon precursor. Ammonia was used as a reactant gas containing nitrogen. High purity nitrogen was used as a carrier gas, and also as a dilution gas and a separator gas. Tetraiodosilane was placed in a bubbler heated by a heat bath. Nitrogen carrier gas and vapor phase tetraiodosilane flowed to an inner zone of the injector, while ammonia reactant gas and nitrogen dilution gas flowed to an outer zone of the injector, and nitrogen separator gas flowed in between to prevent the gas phase reaction of tetraiodosilane and ammonia. All the gas flow rates were regulated by mass flow controllers. The flow rate of the nitrogen carrier gas was 0.1 standard l/min. The flow rate of ammonia was 1.0 standard l/min. The flow rates of the nitrogen dilution and separator gases were 3.0 standard l/min and 1.9 standard l/min, respectively. A temperature for the tetraiodosilane bubbler was 170° C. The precursor delivery line was heated to a temperature up to 20° C. greater than the bubbler temperature in order to avoid precursor recondensation. Carrier gas flow was used to control the precursor delivery rate.

Composition analysis of the films was performed using Rutherford backscattering spectroscopy (RBS). Thickness and composition were determined by comparing measured spectra with simulations. The temperatures in the chamber were varied and deposition of silicon nitride films was achieved at temperatures as low as 350° C. The films were nitrogen rich at deposition temperatures below 550° C. There appeared to be a trend toward stoichiometric deposition when the temperature was increased to 550° C., but apparatus limitations made further temperature increases impossible. The iodine impurity concentration decreased dramatically when the substrate temperature was increased from 350° C. to 400° C., and then decreased slowly with further temperature increases. Growth rates increased greatly with decreased deposition temperature between 450° C. and 350° C. N/Si ratios, iodine concentrations, and growth rates of the films for runs at various temperatures are presented in Table 1.

TABLE 1

| Run Number | Temperature (° C.) | Growth Rate (Å/min.) | N/Si Ratio | Iodine Content (at. %) |
|---|---|---|---|---|
| 243 | 350 | 1375 | 1.8 | 4.2 |
| 242 | 400 | 950 | 1.9 | 2.3 |
| 230 | 450 | 750 | 1.9 | 1.2 |
| 241 | 500 | 800 | 1.9 | 0.9 |
| 244 | 550 | 850 | 1.33 | 0.8 |

Fourier transform infrared spectroscopy (FTIR) was used to determine the chemical bonding and hydrogen concentration in the films. No Si—H bonding was found. N—H bonding concentration decreased with increasing temperature. The films had absolute hydrogen concentrations of about 30 at %, which is comparable to typical filmes formed by PECVD. Structure analysis was performed using x-ray diffraction (XRD). The XRD measurements showed that the films were amorphous. Scanning electron microscopy (SEM) analysis showed a conformal deposition of silicon nitride over a 1×1.6 µm feature size trench structure with 10 nm TiN on top, with step coverage better than 85%. Comparing SEM thickness measurements with the RBS results, the film density of the 450° C. runs was calculated to be 2.4 g/cm$^{-1}$. This film density is comparable to typical PECVD results.

EXAMPLE 2

A pure silicon film was formed using tetraiodosilane as a precursor. Depositions were performed using the CVD reactor system of Example 1. A silicon wafer substrate was placed on a quartz plate holder heated by resistance heating. Prior to deposition, a twenty-five minute pre-clean using plasma and hydrogen gas flow was performed. The power density for the plasma during the pre-clean was 50 W and the hydrogen gas flow for the pre-clean was 600 standard cm$^3$/min. Immediately before deposition, the hydrogen flow was decreased, and the plasma power increased to 75 W. Also, at this time, the chamber pressure was adjusted to 0.1 torr. The substrate temperature was monitored by a thermocouple near the back surface of the quartz holder. Deposition was carried out at substrate temperatures of 300–550° C. The chamber pressure was fixed at 0.1 torr during deposition.

As noted above, tetraiodosilane served as the silicon precursor and was introduced at a flow rates of from 5.0 to 0.1 standard cm$^3$/min. Hydrogen was used as a reactant gas at a flow rate of 60 standard cm$^3$/min and argon as an inert carrier and separator gas flowing at a rate of 100 standard cm$^3$/min. Tetraiodosilane was placed in a bubbler heated by a heat bath. The reactant, carrier, precursor and separator gases flowed into the chamber in the same manner as described above in Example 1, and all the gas flow rates were regulated by mass flow controllers. A temperature for the tetraiodosilane bubbler was 170° C. The precursor delivery line was heated to a temperature up to 20° C. greater than the bubbler temperature in order to avoid precursor recondensation. Carrier gas flow was used to control the precursor delivery rate. A high-purity silicon film was deposited in a deposition time of 30 min.

EXAMPLE 3

Ultraviolet radiation assisted APCVD is used to form a silicon film on fused silica substrate, along with the same CVD chamber as in Example 1. Ultraviolet radiation is used in a wavelengths of from 194 to 254 nm using a high intensity Penn Ray lamp. Tetraiodosilane is used as the silicon precursor. Hydrogen is used as a reactant gas. Triethylamine is introduced into the chamber to act as a complexing agent. A processing temperature of 600° C. is maintained throughout deposition. The chamber pressure throughout deposition is maintained at near atmospheric pressure. The resulting film is pure silicon.

EXAMPLE 4

The ultraviolet radiation assisted APCVD technique using the CVD chamber of Example 1 is employed to form a silicon dioxide film. A Corning 1737 display glass substrate is used in conjunction with the same CVD chamber and the same ultraviolet source providing radiation within the same wavelength range as in Example 1. Tetraiodosilane is used as the silicon precursor. Oxygen functions as a reactant gas and argon is used as a carrier gas. The processing temperature maintained within the chamber is 500° C. The chamber pressure throughout deposition is near atmospheric pressure. The resulting film is of formula $SiO_2$.

The APCVD method of the present invention allows for higher throughput and is more cost-effective and efficient than prior art thermal and plasma assisted CVD methods, because very high temperatures and cumbersome, expensive vacuum equipment are not required. The use of iodosilane precursors promotes high film growth rates, is compatible with low temperature film deposition, and eliminates the need to use traditional silane precursors, which have various associated hazards. Efficient, low temperature, high throughput, vacuum free CVD is especially desirable for use with large area substrate TFT applications such as flat panel displays and solar applications. The separate embodiment involving the use of ultraviolet radiation provides an additional alternative CVD method which allows for lower processing temperatures and even higher throughput, particularly for transparent substrates such as the display glass used in flat panel displays and solar applications. The films deposited by the method of the present invention have hydrogen concentrations and densities that are comparable to those of typical PECVD films, but they are more efficient and economical to manufacture that PECVD films.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method for near atmospheric pressure chemical vapor deposition of a silicon based film onto a substrate, comprising:

(a) introducing into a deposition chamber at about atmospheric pressure:
  (i) a substrate;
  (ii) a single source precursor in a vapor state, wherein the precursor comprises silicon;
  (iii) at least one reactant gas; and
  (iv) a complexing agent selected from the group consisting of a tertiary amine and complexing agents having a chromophore;
(b) providing ultraviolet radiation to the chamber such that the radiation reaches an interface between the substrate and the precursor; and
(c) heating the substrate for a period of time sufficient to deposit a silicon based film on the substrate.

2. A method for near atmospheric pressure chemical vapor deposition of a silicon-based film selected from the group consisting of silicon-nitrogen based films, comprising (a) introducing into a deposition chamber at about atmospheric pressure:
  (i) substrate:
  (ii) a single source precursor in a vapor state having at least three iodine atoms bound to silicon; and
  (iii) at least one nitrogen-containing reactant gas;
(b) maintaining the substrate at a deposition temperature within the chamber of from about 250° C. to about 600° C. for a period of time sufficient to deposit a silicon-nitrogen based film having less than 5 at % iodide.

3. The method according to claim 2, wherein the iodosilane precursor has a formula:

$$I_{(4-n)}SiX_n \qquad (I)$$

wherein n is 0 or 1 and X is selected from the group consisting of Br, Cl and $SiI_3$.

4. The method according to claim 2, wherein the substrate comprises a material selected from the group consisting of metals, metal alloys, transparent glass, display glass, borosilicate glass, temperature-resistant flat panels, quartz, silicon, silicon dioxide, silicon nitrogen materials, gallium arsenide, and polymeric materials.

5. The method according to claim 3, wherein the substrate is transparent glass.

6. The method according to claim 2, wherein the reactant gas flitter comprises a gas selected from the group consisting of nitrogen, argon, helium, neon, krypton, and xenon.

7. The method according to claim 2, wherein the deposition temperature within the chamber is maintained at from about 350° C. to about 600° C.

8. The method according to claim 2, wherein the deposition temperature within the chamber is maintained at from about 350° C. to about 550° C.

9. The method according to claim 2, wherein the at least one reactant gas is selected from the group consisting of ammonia, and hydrazine.

10. The method according to claim 2, further comprising
(c) depositing a second film on the film deposited on the substrate for forming a multilayered structure while the substrate remains fixed in the chamber.

11. A method for near atmospheric pressure chemical vapor deposition of a silicon based film onto a substrate, comprising
(a) introducing into a deposition chamber at about atmospheric pressure:
  (i) a substrate;
  (ii) a single source precursor in a vapor state having the formula:

$$I_{(4-n)}SiX_n \qquad (I)$$

wherein n is 0 or 1 and X is selected from the group consisting of Br, Cl, and SiI$_3$; and (iii) at least one reactant gas;

(b) providing ultraviolet radiation to the chamber such that the radiation reaches an interface between the substrate and the precursor; and (c) heating the substrate for a period of time sufficient to deposit a silicon based film on the substrate having less than 5 at % iodide.

12. The method according to claim 11, wherein a deposition temperature within the chamber is between about 100° C. and about 600° C.

13. The method according to claim 11, wherein the substrate is transparent and the ultraviolet radiation is provided by a radiation source such that the radiation passes through the transparent substrate to the interface between the substrate and the precursor.

14. The method according to claim 13, wherein the transparent substrate is display glass.

15. The method according to claim 11, wherein the ultraviolet radiation passing beyond the interface into the chamber is reflected back to the interface.

16. The method according to claim 11, wherein the ultraviolet radiation has a wavelength from about 194 nm to about 254 nm.

17. A method for near atmospheric pressure chemical vapor deposition of a silicon-based film selected from the group consisting of silicon-nitrogen based films, comprising (a) introducing into a deposition chamber at a pressure of about 600 torr to about 1000 torr:

(i) a substrate;

(ii) a single source precursor in a vapor state having a formula $$I_{(4-n)}SiX_n \qquad (I)$$

wherein n is 0 or 1 and X is selected from the group consisting of Br, Cl and SiI$_3$; and (iii) at least one nitrogen-containing reactant gas; and (b) maintaining the substrate at a deposition temperature within the chamber of from about 250° C. to about 600° C. for a period of time sufficient to deposit a silicon nitrogen based film on a substrate having less than 5 at % iodide.

* * * * *

UNITED STATES PATENT AND TRADEMARK OFFICE
CERTIFICATE OF CORRECTION

PATENT NO. : 6,586,056 B2
DATED : July 1, 2003
INVENTOR(S) : Barry C. Arkles et al.

It is certified that error appears in the above-identified patent and that said Letters Patent is hereby corrected as shown below:

<u>Title page,</u>
Item [73], Assignees, please add Assignee name -- The Research Foundation of State University of New York, Albany, NY --.

Signed and Sealed this

Twenty-third Day of December, 2003

JAMES E. ROGAN
*Director of the United States Patent and Trademark Office*